US008882536B2

(12) United States Patent
Utz (10) Patent No.: US 8,882,536 B2
(45) Date of Patent: Nov. 11, 2014

(54) POWER DISTRIBUTION UNIT WITH INTERCHANGEABLE OUTLET ADAPTER TYPES

(71) Applicant: Chatsworth Products, Inc., Westlake Village, CA (US)

(72) Inventor: James Utz, Round Rock, TX (US)

(73) Assignee: Chatsworth Products, Inc., Westlake Village, CA (US)

( * ) Notice: Subject to any disclaimer, the term of this patent is extended or adjusted under 35 U.S.C. 154(b) by 33 days.

(21) Appl. No.: 13/751,118

(22) Filed: Jan. 27, 2013

(65) Prior Publication Data

US 2013/0196535 A1 Aug. 1, 2013

Related U.S. Application Data

(60) Provisional application No. 61/591,369, filed on Jan. 27, 2012.

(51) Int. Cl.
| *H01R 13/60* | (2006.01) |
| *H01R 12/50* | (2011.01) |
| *H01R 43/26* | (2006.01) |
| *H01R 25/16* | (2006.01) |
| *H05K 7/14* | (2006.01) |
| *H01R 103/00* | (2006.01) |
| *H01R 13/74* | (2006.01) |
| *H01R 24/78* | (2011.01) |
| *H01R 25/00* | (2006.01) |
| *H01R 27/02* | (2006.01) |

(52) U.S. Cl.
CPC ............ *H01R 23/6866* (2013.01); *H01R 43/26* (2013.01); *H01R 25/164* (2013.01); *H05K 7/1492* (2013.01); *H01R 2103/00* (2013.01); *H01R 13/743* (2013.01); *H01R 24/78* (2013.01); *H01R 25/006* (2013.01); *H01R 27/02* (2013.01)
USPC .......................................... 439/536; 439/535

(58) Field of Classification Search
CPC ... H01R 13/514; H01R 27/02; H01R 13/6658
USPC .................................................. 439/535, 536
See application file for complete search history.

(56) References Cited

U.S. PATENT DOCUMENTS

| 2,271,463 A | 1/1942 | Reeves |
| 3,066,902 A | 12/1962 | Conil |

(Continued)

FOREIGN PATENT DOCUMENTS

| EP | 646811 A2 | 4/1995 |
| WO | 9918580 A2 | 4/1999 |
| WO | 2009089008 A2 | 7/2009 |

OTHER PUBLICATIONS

Wikipedia entry for "IEC 60320," retrieved May 6, 2014.*

(Continued)

*Primary Examiner* — Ross Gushi
(74) *Attorney, Agent, or Firm* — Tillman Wright, PLLC; James D. Wright; David R. Higgins (57) ABSTRACT

A power distribution unit includes a printed circuit board, having a plurality of outlet adapter receiving locations, and a plurality of outlet adapters. Each outlet adapter has a user-facing outlet connector and a printed circuit board-facing inlet connector. The outlet connector of a first of the plurality of outlet adapters is different from the outlet connector of a second of the plurality of outlet adapters. The inlet connector of each outlet adapter includes terminals. The terminals of the inlet connector of the first of the plurality of outlet adapters are arranged in a terminal pattern that matches that of the terminals of the inlet connector of the second of the plurality of outlet adapters such that the first and the second outlet adapters are interchangeably attachable at any of the plurality of outlet adapter receiving locations of the printed circuit board.

16 Claims, 9 Drawing Sheets

(56) References Cited

U.S. PATENT DOCUMENTS

| | | |
|---|---|---|
| 3,088,054 A | 4/1963 | Meyer |
| 3,295,905 A | 1/1967 | Sisk et al. |
| 3,633,075 A | 1/1972 | Hawkins |
| 4,015,397 A | 4/1977 | Flachbarth et al. |
| 4,046,957 A | 9/1977 | Taylor et al. |
| 4,675,900 A | 6/1987 | Temkin |
| 4,699,289 A | 10/1987 | You |
| 4,768,845 A | 9/1988 | Yeh |
| 4,782,245 A | 11/1988 | Henry |
| 5,141,185 A | 8/1992 | Rumbold et al. |
| 5,149,026 A | 9/1992 | Allen |
| 5,216,579 A | 6/1993 | Basara et al. |
| 5,295,041 A | 3/1994 | Metivier et al. |
| 5,326,934 A | 7/1994 | LeMaster et al. |
| 5,347,430 A | 9/1994 | Curlee et al. |
| 5,370,553 A | 12/1994 | Zimmerman |
| 5,381,315 A | 1/1995 | Hamaguchi et al. |
| 5,391,084 A | 2/1995 | Kreitzman |
| 5,443,312 A | 8/1995 | Schluter |
| 5,497,444 A | 3/1996 | Wheeler |
| 5,568,362 A | 10/1996 | Hansson |
| D375,292 S | 11/1996 | D'Amato |
| 5,595,494 A | 1/1997 | Wiebe |
| 5,609,402 A | 3/1997 | Kemp |
| 5,626,316 A | 5/1997 | Smigel et al. |
| 5,640,482 A | 6/1997 | Barry et al. |
| 5,758,002 A | 5/1998 | Walters |
| 5,788,087 A | 8/1998 | Orlando |
| 5,911,661 A | 6/1999 | Murray et al. |
| 5,921,795 A | 7/1999 | Weener et al. |
| 5,921,806 A | 7/1999 | Shuey |
| 5,961,081 A | 10/1999 | Rinderer |
| 6,008,621 A | 12/1999 | Madison et al. |
| 6,019,323 A | 2/2000 | Jette |
| 6,047,838 A | 4/2000 | Rindoks et al. |
| 6,127,631 A | 10/2000 | Green et al. |
| 6,164,582 A | 12/2000 | Vara |
| 6,201,687 B1 | 3/2001 | Murray |
| 6,220,880 B1 * | 4/2001 | Lee et al. ............. 439/214 |
| 6,231,379 B1 | 5/2001 | Shen |
| 6,250,956 B1 * | 6/2001 | Pulizzi ............ 439/535 |
| 6,259,604 B1 | 7/2001 | Kuster |
| 6,307,997 B1 | 10/2001 | Walters et al. |
| 6,318,680 B1 | 11/2001 | Benedict et al. |
| 6,326,547 B1 | 12/2001 | Saxby et al. |
| 6,327,139 B1 | 12/2001 | Champion et al. |
| 6,332,594 B2 | 12/2001 | Shelton et al. |
| 6,347,493 B1 | 2/2002 | Jette |
| 6,353,532 B1 | 3/2002 | Landrum et al. |
| 6,373,721 B2 | 4/2002 | Lecinski et al. |
| 6,403,885 B1 | 6/2002 | Baker et al. |
| D462,056 S | 8/2002 | Chung |
| 6,449,912 B2 | 9/2002 | Jette |
| 6,461,052 B1 | 10/2002 | Hines et al. |
| 6,481,678 B1 | 11/2002 | Chong |
| 6,494,411 B1 | 12/2002 | Bjorklund |
| 6,513,764 B2 | 2/2003 | Koziol |
| 6,541,705 B1 | 4/2003 | McGrath |
| 6,605,782 B1 | 8/2003 | Krietzman et al. |
| 6,614,665 B2 | 9/2003 | Witty et al. |
| 6,629,675 B1 | 10/2003 | Bjorklund et al. |
| 6,637,165 B2 | 10/2003 | Jette |
| 6,663,435 B2 | 12/2003 | Lincoln et al. |
| 6,672,896 B1 | 1/2004 | Li |
| 6,728,461 B1 | 4/2004 | Senatore et al. |
| 6,760,531 B1 | 7/2004 | Solheid et al. |
| 6,782,617 B2 * | 8/2004 | Pulizzi ............ 29/854 |
| 6,884,942 B2 | 4/2005 | McGrath et al. |
| 6,937,461 B1 * | 8/2005 | Donahue, IV ............ 361/622 |
| 6,981,893 B2 | 1/2006 | Barker et al. |
| 7,043,543 B2 | 5/2006 | Ewing et al. |
| 7,092,258 B2 | 8/2006 | Hardt et al. |
| 7,097,047 B2 | 8/2006 | Lee et al. |
| 7,141,891 B2 | 11/2006 | McNally et al. |
| 7,171,461 B2 | 1/2007 | Ewing et al. |
| D549,650 S | 8/2007 | Russell et al. |
| 7,268,998 B2 | 9/2007 | Ewing et al. |
| 7,312,980 B2 | 12/2007 | Ewing et al. |
| D559,184 S | 1/2008 | Russell et al. |
| D562,766 S | 2/2008 | Yang |
| D564,964 S | 3/2008 | Caine et al. |
| 7,345,241 B2 | 3/2008 | Caveney et al. |
| 7,352,947 B2 | 4/2008 | Phung et al. |
| 7,362,941 B2 | 4/2008 | Rinderer et al. |
| 7,365,964 B2 * | 4/2008 | Donahue, IV ............ 361/622 |
| D575,237 S | 8/2008 | Shiga et al. |
| D576,552 S | 9/2008 | Caine et al. |
| 7,637,771 B2 | 12/2009 | Laursen |
| 7,661,982 B2 | 2/2010 | Tachi et al. |
| 7,702,771 B2 | 4/2010 | Ewing et al. |
| 7,712,709 B2 | 5/2010 | Winchester |
| 7,777,365 B2 | 8/2010 | Cleveland |
| D631,731 S | 2/2011 | Chen |
| 7,974,105 B2 | 7/2011 | Dean, Jr. et al. |
| 8,033,867 B1 * | 10/2011 | Kessler et al. ............ 439/652 |
| D660,235 S | 5/2012 | Liang-Hsu et al. |
| 8,263,867 B2 | 9/2012 | Garza et al. |
| D677,629 S | 3/2013 | Corona |
| D678,200 S | 3/2013 | Corona |
| D678,202 S | 3/2013 | Corona |
| 8,411,465 B2 | 4/2013 | Dean, Jr. et al. |
| 8,437,147 B2 | 5/2013 | Dean, Jr. et al. |
| D687,778 S | 8/2013 | Utz |
| 2001/0002689 A1 | 6/2001 | Shelton et al. |
| 2001/0030266 A1 | 10/2001 | MacDonald et al. |
| 2002/0176631 A1 | 11/2002 | Puetz et al. |
| 2004/0077212 A1 * | 4/2004 | Pulizzi ............ 439/535 |
| 2004/0146266 A1 | 7/2004 | Solheid et al. |
| 2005/0057912 A1 | 3/2005 | Hardt et al. |
| 2005/0259383 A1 | 11/2005 | Ewing |
| 2006/0118685 A1 | 6/2006 | Schluter et al. |
| 2008/0180917 A1 | 7/2008 | Lawrence |
| 2009/0038845 A1 | 2/2009 | Fransen et al. |
| 2009/0273915 A1 | 11/2009 | Dean, Jr. et al. |
| 2010/0193754 A1 | 8/2010 | Garza et al. |
| 2010/0200707 A1 | 8/2010 | Garza et al. |
| 2011/0056895 A1 | 3/2011 | Tichy |
| 2011/0211328 A1 | 9/2011 | Dean, Jr. et al. |
| 2011/0211329 A1 | 9/2011 | Dean, Jr. et al. |
| 2013/0196532 A1 | 8/2013 | Utz et al. |
| 2013/0215581 A1 | 8/2013 | Utz |

OTHER PUBLICATIONS

Specification from WIREMOLD.com—Plug-In Outlet Center® Units—ED795R4—Updated Mar. 2003.

Information Disclosure Statement (IDS) Letter Regarding Common Patent Application(s), dated May 7, 2013.

* cited by examiner

POWER DISTRIBUTION UNIT WITH INTERCHANGEABLE OUTLET ADAPTER TYPES

CROSS-REFERENCE TO RELATED APPLICATIONS

The present application is a U.S. non-provisional patent application of, and claims priority under 35 U.S.C. §119(e) to, U.S. provisional patent application Ser. No. 61/591,369, filed Jan. 27, 2012, which '369 application is incorporated by reference herein in its entirety. Additionally, the entirety of each of the following co-pending, commonly-assigned U.S. patent applications, and any application publication thereof, is expressly incorporated herein by reference:
  (a) U.S. provisional patent application Ser. No. 61/591,342, filed Jan. 27, 2012 and entitled, "BOARD-MOUNTED CIRCUIT BREAKERS FOR ELECTRONIC EQUIPMENT ENCLOSURES;"
  (b) U.S. provisional patent application Ser. No. 61/591,379, filed Jan. 27, 2012 and entitled, "CABLE RETENTION SYSTEM FOR POWER DISTRIBUTION UNIT;"
  (c) U.S. non-provisional patent application Ser. No. 13/751,117, filed Jan. 27, 2013, published on Aug. 22, 2013 as US 2013/0215581 A1 and entitled, "BOARD-MOUNTED CIRCUIT BREAKERS FOR ELECTRONIC EQUIPMENT ENCLOSURES;" and
  (d) U.S. non-provisional patent application Ser. No. 13/751,119, filed Jan. 27, 2013, published on Aug. 1, 2013 as US 2013/0196532 A1 and entitled, "CABLE RETENTION SYSTEM FOR POWER DISTRIBUTION UNIT."

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

1. Field of the Present Invention

The present invention relates generally to a power distribution unit, and, in particular, to a power distribution unit providing for interchangeable outlet adapter types.

2. Background

Cabinets, including rack frame cabinets and other electronic equipment enclosures, are commonly used for storing equipment, often electrical equipment such as computer and telecommunications equipment with multiple components. It naturally follows that the multi-component electrical equipment being stored in cabinets requires multiple sources of power, and that power distribution units may be provided to facilitate this. As used herein, a "power distribution unit" shall be understood to mean a unitary or semi-unitary structure containing multiple power receptacles or outlets.

In typical power distribution units (PDUs), the multiple receptacles or outlets are arranged in one or more rows or columns. The receptacles or outlets may be of different types, but are typically selected from conventional receptacle designs such as those set forward by International Electrotechnical Commission (IEC) 60320 standards. Within a particular PDU, different receptacle types may be used in order to provide the user with greater flexibility in connecting electrical components thereto or to meet certain design criteria. For example, a particular PDU may include one or more C13-type outlets as well as one or more C19-type outlets, with a customized circuit board for distribution of electrical power to the various outlets. However, known power distribution units are manufactured in specific, non-changeable outlet type combinations, with different combinations requiring many different part sets. In particular, a different circuit board design is required for each different combination of outlets, and once manufactured, the combination cannot be changed. For example, a PDU having three C13 outlets and one C19 outlet would require a different circuit board than a PDU having two C13 outlets and two C19 outlets, and would have to be manufactured separately. The main factor in this situation is that each type of receptacle generally has a different male terminal pattern at its inlet (i.e., on its "back" side). For instance, two commonly used receptacle types (C13-type outlets and C19-type outlets) have inlets with wholly distinct footprints (i.e., they have different male terminal patterns).

However, in many electrical systems a diverse range of power needs often arises at a single circuit board location, and these needs often change after original installation is complete. Furthermore, maintaining large part number counts increases manufacturing counts. Thus, a need exists for a single power distribution unit to be capable of interchangeably accommodating different types of outlets using a single circuit board. This, and other needs, is met by one or more aspects of the present invention.

SUMMARY OF THE PRESENT INVENTION

The present invention comprises a power distribution unit. Broadly defined, the present invention according to a first aspect includes a power distribution unit substantially as shown and described.

Broadly defined, the present invention according to a second aspect includes a power distribution unit with interchangeable outlet types, substantially as shown and described.

Broadly defined, the present invention according to a third aspect includes a method of interchanging outlet adapter types in a power distribution unit, substantially as shown and described.

In features of this aspect, the method may further include the step of interchanging a first type of outlet adapter with a second type of outlet adapter, wherein the first and second outlet adapters share a common inlet connection configuration; the method may further include the step of interchanging a C13-type outlet adapter with a C19-type outlet adapter; and/or the method may further include the step of interchanging a C19-type outlet adapter with a C13-type outlet adapter.

Broadly defined, the present invention according to a fourth aspect includes a power distribution unit. The power distribution unit includes a cover plate, a printed circuit board and a plurality of outlet adapters, each having a standard type of outlet connection and an inlet connection. The inlet connection of at least one of the plurality of outlet adapters includes a terminal mounting pattern matching that of the inlet connection of a different type of outlet adapter.

In features of this aspect, the plurality of outlet adapters may include at least one C13-type outlet adapter and at least one C19-type outlet adapter; and/or the C13-type outlet adapter may have a terminal mounting pattern matching that of the C19-type outlet adapter.

Broadly defined, the present invention according to a fifth aspect includes a power distribution unit that has a printed circuit board, having a plurality of outlet adapter receiving locations, and a plurality of outlet adapters. Each of the plurality of outlet adapters has a user-facing outlet connector and a printed circuit board-facing inlet connector. The inlet connector of each outlet adapter includes terminals. The outlet connector of a first of the plurality of outlet adapters is different from the outlet connector of a second of the plurality of outlet adapters. The terminals of the inlet connector of the first of the plurality of outlet adapters are arranged in a terminal pattern that matching that of the terminals of the inlet connector of the second of the plurality of outlet adapters such that the first and the second outlet adapters are interchangeably attachable at any of the plurality of outlet adapter receiving locations of the printed circuit board.

In features of this aspect, the plurality of outlet adapters may include at least one C13-type outlet adapter and at least one C19-type outlet adapter; the C13-type outlet adapter may have a an inlet connector terminal pattern matching that of the C19-type outlet adapter; the printed circuit board may include eight outlet adapter receiving locations to accommodate eight outlet adapters; the power distribution unit may further include a cover plate; the cover plate may include differently sized openings to accommodate outlet adapters of varying size; each outlet adapter receiving location of the printed circuit board may have a set of female terminals arranged in a pattern; the terminal patterns of the outlet adapter receiving locations of the printed circuit board may be identical to one another; and/or the terminal mounting pattern of each of the plurality of outlet adapters may be comprised of a set of male terminals.

Broadly defined, the present invention according to a sixth aspect is a power distribution unit that has a printed circuit board, having a plurality of outlet adapter receiving locations, and a plurality of outlet adapters. Each of the outlet adapters has a printed circuit board-facing inlet connector. A first of the plurality of outlet adapters has a user-facing C13-type outlet connector, and a second of the plurality of outlet adapters having a user-facing C19-type outlet connector. The inlet connector of each outlet adapter includes terminals. The terminals of the inlet connector of the first of the plurality of outlet adapters are arranged in a terminal pattern that matching that of the terminals of the inlet connector of the second of the plurality of outlet adapters such that the first and the second outlet adapters are interchangeably attachable at any of the plurality of outlet adapter receiving locations of the printed circuit board.

In features of this aspect, the printed circuit board may include eight outlet adapter receiving locations to accommodate eight outlet adapters; the power distribution unit may further include a cover plate; the cover plate may include differently sized openings to accommodate outlet adapters of varying size; each outlet adapter receiving location of the printed circuit board may have a set of female terminals arranged in a pattern; and/or the terminal patterns of the outlet adapter receiving locations of the printed circuit board may be identical to one another.

Broadly defined, the present invention according to a seventh aspect is a method of interchanging outlet adapter types in a power distribution unit. The method includes: providing a printed circuit board, as part of a power distribution unit, having a plurality of outlet adapter receiving locations and a first outlet adapter, the first outlet adapter having a user-facing outlet connector, of a first outlet connector type, and a printed circuit board-facing inlet connector, and the first outlet adapter being attached to the printed circuit board, via the inlet connector thereof, at a selected one of the plurality of outlet adapter receiving locations; removing the first outlet adapter from the printed circuit board; providing a second outlet adapter, having a user-facing outlet connector, of a second outlet connector type that is different from the first outlet connector type, and a printed circuit board-facing inlet connector; and attaching the second outlet adapter, via the inlet connector thereof, to the printed circuit board at the selected one of the plurality of adapter receiving locations.

In a feature of this aspect, the first outlet adapter may have a C13-type outlet connector type, and the second outlet adapter may have a C19-type outlet connector type.

In another feature of this aspect, the first outlet adapter may have a C19-type outlet connector type, and the second outlet adapter may have a C13-type outlet connector type.

In another feature of this aspect, the inlet connector of the first outlet adapter includes terminals arranged in a pattern, the inlet connector of the second outlet adapter includes terminals arranged in a pattern, and the terminal pattern of the first outlet adapter may match that of the second outlet adapter.

In another feature of this aspect, the method may further include a step, prior to the step of removing the first outlet adapter, of removing a first cover plate that is configured with an opening, of a first size, to accommodate the first outlet adapter, and may still further include a step, after the step of attaching the second outlet adapter, of replacing the first cover plate with a second cover plate that is configured with an opening, of a second size, to accommodate the second outlet adapter.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. As should be understood, any embodiment may incorporate only one or a plurality of the above-disclosed aspects of the invention and may further incorporate only one or a plurality of the above-disclosed features. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Regarding applicability of 35 U.S.C. §112, ¶6, no claim element is intended to be read in accordance with this statutory provision unless the explicit phrase "means for" or "step for" is actually used in such claim element, whereupon this statutory provision is intended to apply in the interpretation of such claim element.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, one or more preferred embodiments of the present invention are next described. The following description of one or more preferred embodiment(s) is merely exemplary in nature and is in no way intended to limit the invention, its application, or uses.

Figure 1:
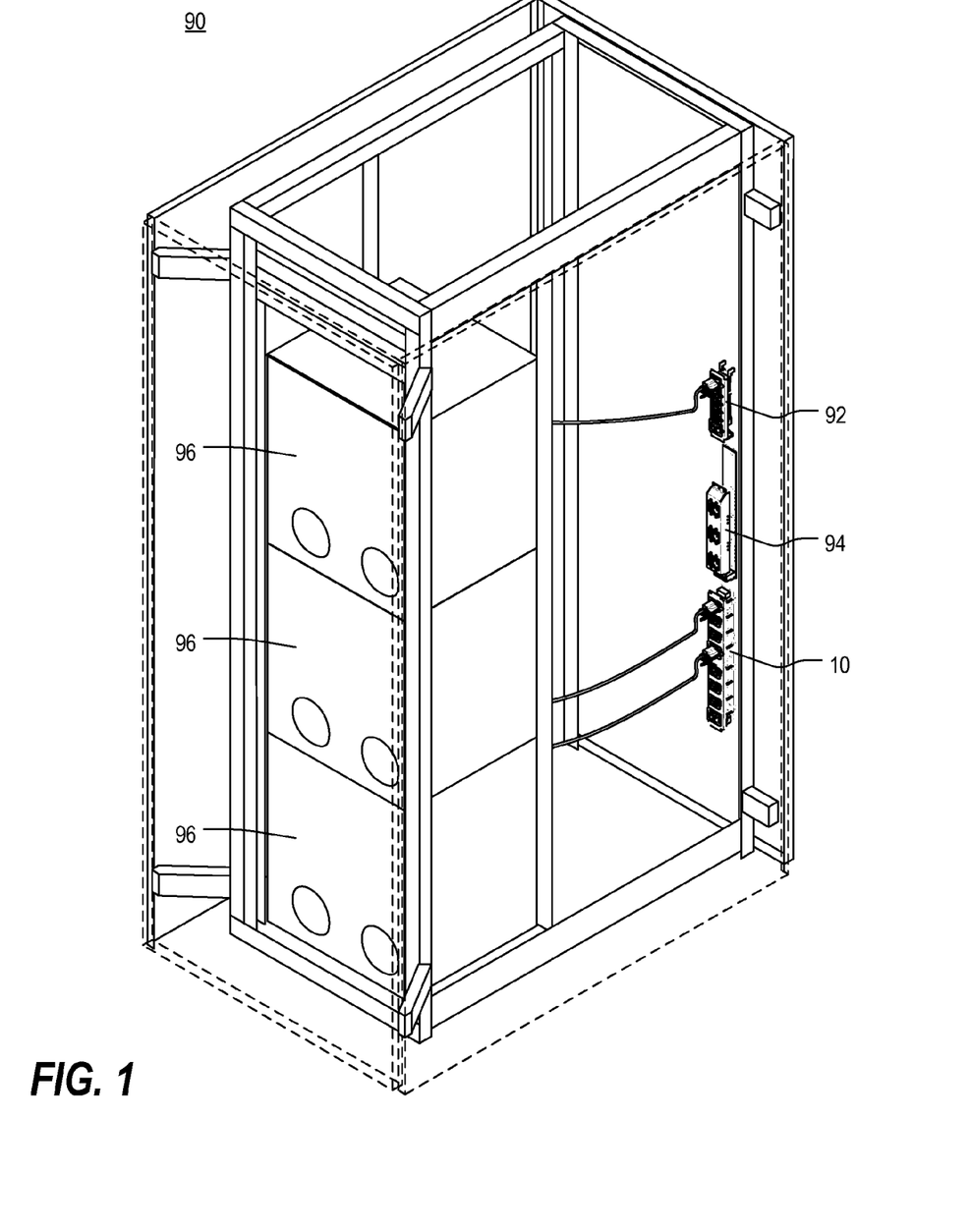
FIG. 1 is a partially schematic front isometric view of an electronic equipment enclosure having power distribution units mounted therein in accordance with one or more preferred embodiments of the present invention.

FIG. 1 is a partially schematic front isometric view of an electronic equipment enclosure 90 having a power distribution unit 10 mounted therein in accordance with one or more preferred embodiments of the present invention. The power distribution unit 10 may be part of a electrical supply system that also includes such devices as other power distribution units 92 and one or more board-mounted circuit breaker assembly 94. The electrical supply system has a general purpose of providing power to electronic equipment, such as servers 96, that is installed in the enclosure 90.

Figure 2:
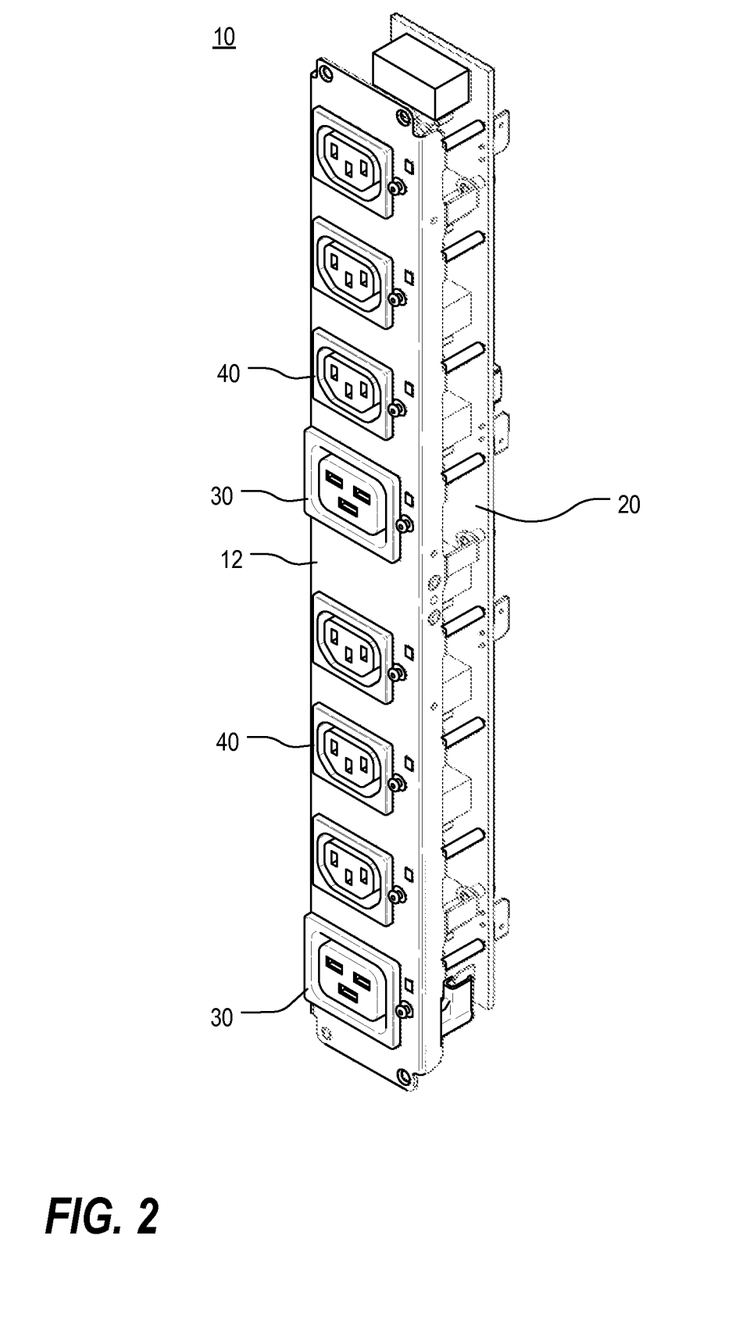
FIG. 2 is a front isometric view of one of the power distribution units of FIG. 1 in accordance with one or more preferred embodiments of the present invention.

FIG. 2 is a front isometric view of one of the power distribution units 10 of FIG. 1 in accordance with one or more preferred embodiments of the present invention. The power distribution unit 10 includes a cover plate 12, a printed circuit board (PCB) 20 and a plurality of receptacles or outlet adapters 30,40. In particular, the power distribution unit 10 is configured to accommodate a plurality of separate outlet adapters 30,40, which may be of different types. For example, in the particular embodiment depicted in FIG. 2, the power distribution unit 10 includes two C19-type outlet adapters 30 and six C13-type outlet adapters 40.

Figure 3:
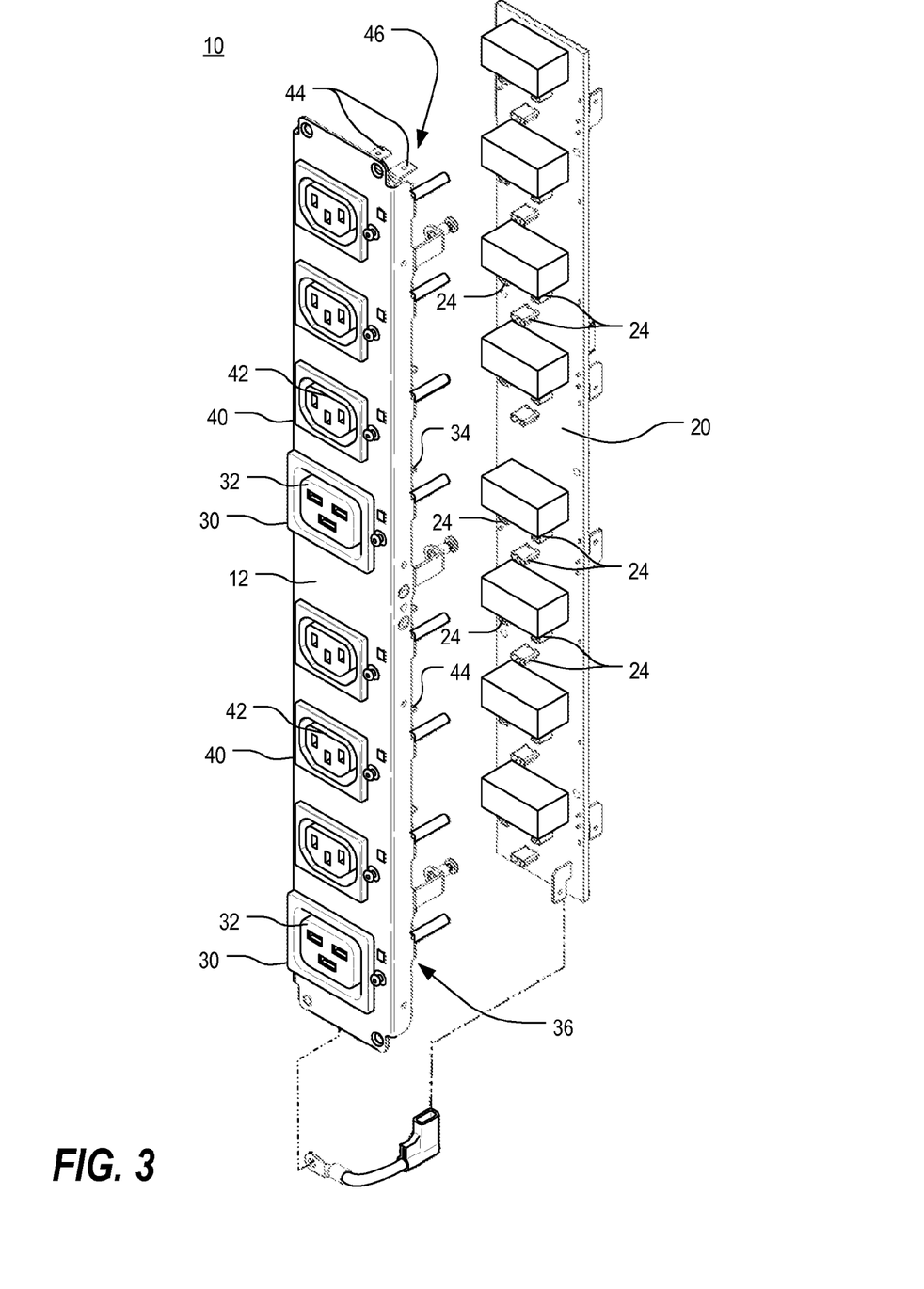
FIG. 3 is a partially exploded front isometric view of the power distribution unit of FIG. 2.

FIG. 3 is a partially exploded front isometric view of the power distribution unit 10 of FIG. 2. With reference to FIGS. 2 and 3, the cover plate 12 and adapters 30,40 are aligned with the printed circuit board 20 such that male terminals 34,44 of the inlet side of the adapters 30,40 matingly pair with a terminal set 26, each of which includes three female terminals 24, on the printed circuit board 20. Notably, as will be explained in greater detail below, the power distribution unit 10 can interchangeably accommodate outlet adapters 30,40 of differing types without changing the PCB 20 itself. In particular, each of the eight terminal sets 26 provided on the PCB 20 of FIG. 3 uses the same footprint; i.e., the female terminals 24 in each terminal set 26 are positioned and oriented in the same way as the female terminals 24 in every other terminal set 26.

Figure 4:
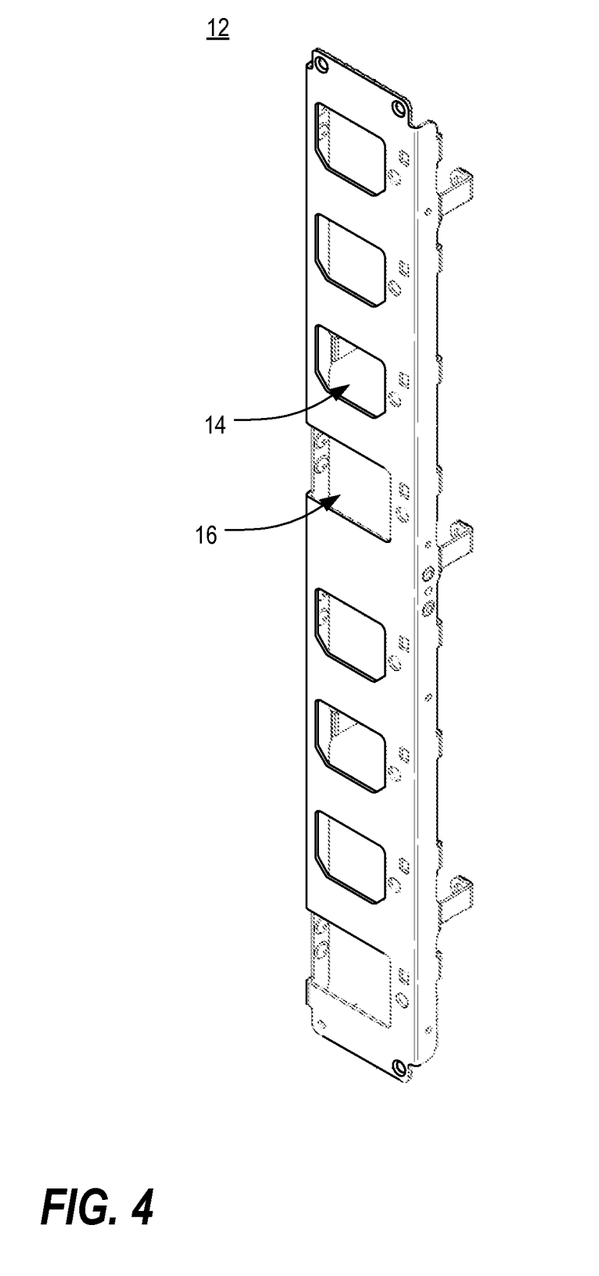
FIG. 4 is a front isometric view of a cover plate of the power distribution unit of FIG. 2.
Figure 5:
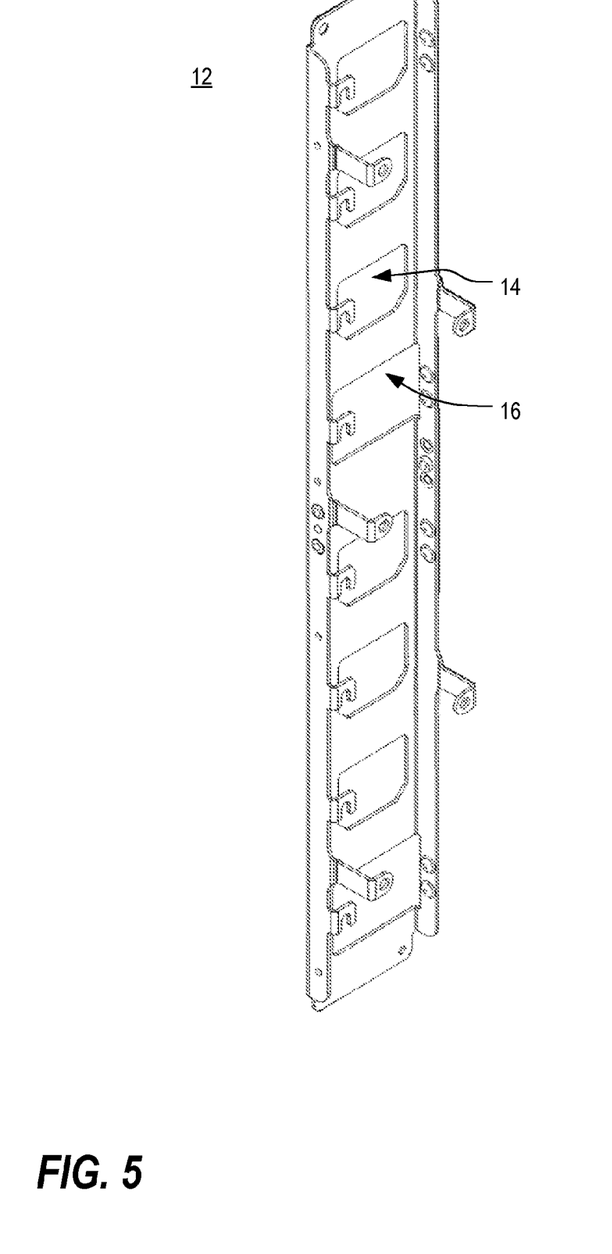
FIG. 5 is a rear isometric view of the cover plate of FIG. 4.

FIG. 4 is a front isometric view of a cover plate 12 of the power distribution unit 10 of FIG. 2; and FIG. 5 is a rear isometric view of the cover plate 12 of FIG. 4. As shown therein, and with reference to FIG. 3, the cover plate 12 includes differently sized openings 14,16 to accommodate differently sized outlet adapters 30,40. In particular, some openings 14 are sized to accommodate C13-type outlet adapters 40, while other openings 16 are sized to accommodate C19-type outlet adapters 30.

Figure 6:
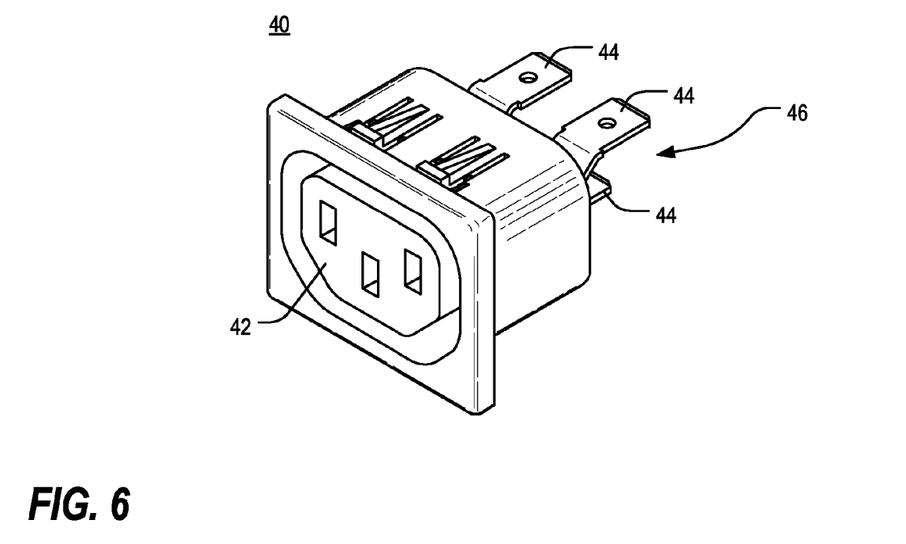
FIG. 6 is a front isometric view of a C13-type outlet adapter of the power distribution unit of FIG. 2.
Figure 7:
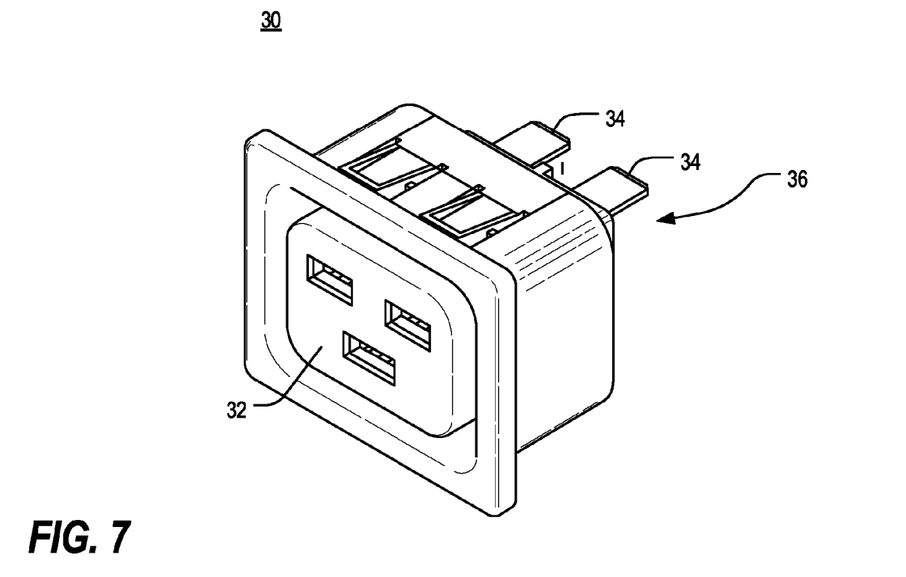
FIG. 7 is a front isometric view of a C19-type outlet adapter of the power distribution unit of FIG. 2.
Figure 8:
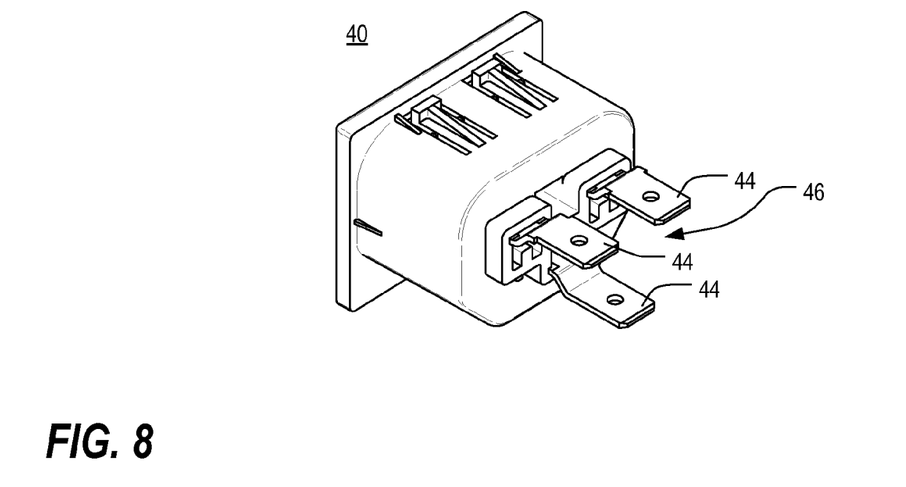
FIG. 8 is a rear isometric view of the C13-type outlet adapter of FIG. 6.
Figure 9:
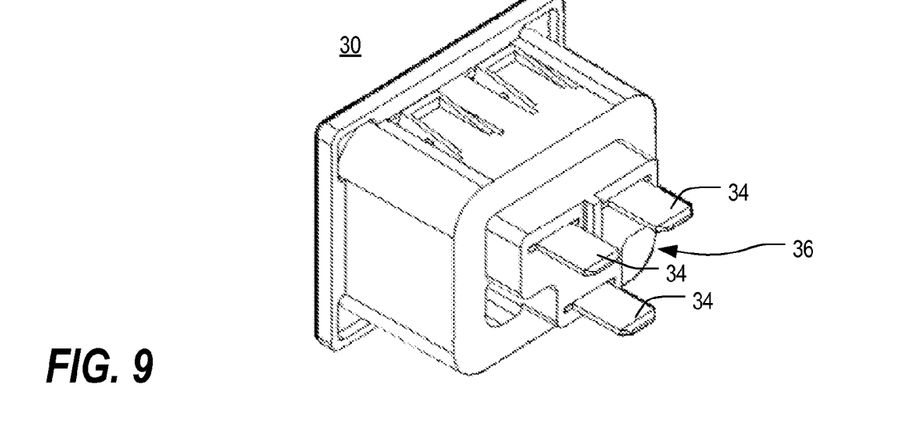
FIG. 9 is a rear isometric view of the C19-type outlet adapter of FIG. 7.

FIGS. 6 and 8 are front and rear isometric views, respectively, of a C13-type outlet adapter 40 of the power distribution unit 10 of FIG. 2, and FIGS. 7 and 9 are front and rear isometric views, respectively, of a C19-type outlet adapter 30 of the power distribution unit 10 of FIG. 2. As shown in FIGS. 6-9, each outlet adapter 30,40 includes a connector 32,42 at a user-facing side and an inlet 36,46, having a standardized footprint, at the opposite side thereof. In particular, the C13-type outlet adapter 40 includes a user-facing C13-type connector 42 and a PCB-facing inlet 46 having male terminals 44 that extend from the rear of the adapter 40 for pairing with a female terminal set 26 on the printed circuit board 20. Similarly, the C19-type outlet adapter 30 includes a user-facing C19-type connector 32 and a PCB-facing inlet 36 having male terminals 34 that extend from the rear of the adapter 40 for pairing with a female terminal set 26 on the printed circuit board 20.

Notably, in contrast to conventional couplers, the different outlet adapters 40,30 of FIGS. 6 and 8 and FIGS. 7 and 9, respectively, utilize inlet configurations having a common footprint. By way of explanation, a user-facing C19-type outlet is conventionally paired with a PCB-facing C20-type connector to form a C19/C20 coupler, while a user-facing C13-type outlet is conventionally paired with a PCB-facing C14-type connector to form a C13/C14 coupler. C19/C20 couplers and C13/C14 couplers are not interchangeable, however, because C20-type connectors and C14-type connectors have different footprints, and thus require different terminal sets to be provided on the printed circuit board 20.

In the present invention, however, each user-facing outlet, regardless of type (C13, C19, etc.) is paired with a PCB-facing connector that utilizes a single, standardized footprint, and the resulting outlet adapter may thus be connected to any terminal set 26 on the PCB 20. In particular, in the illustrated embodiments, the C19-type outlet adapter 30 and the C13-type outlet adapter 40 each utilize an inlet connector 36,46 having the footprint of a conventional C20-type inlet connector, and the female terminal sets 26 are arranged to receive any set of male terminals (including the male terminals 34,44 of the adapters 30,40 of FIGS. 6-9) having this footprint. In other words, rather than use a C14-type inlet connector, as would be typical with a conventional C13-type outlet adapter, the C13-type outlet adapter 40 shown herein utilizes the same inlet connector footprint as that of the C19-type outlet adapter 30. This is perhaps best shown in FIGS. 8 and 9, wherein the pattern of the male terminals 44 of the C13-type outlet adapter 40 can be seen to match the pattern of the male terminals 34 of the C19-type outlet adapter 30.

With matching terminal patterns, it is possible to interchange or exchange different types of outlet adapters 30,40 within the same power distribution unit 10. Because the two different types of outlet adapters 30,40 share a common inlet footprint (which may be the footprint of a C20-type inlet connector), the two types are interchangeable.

Figure 10:
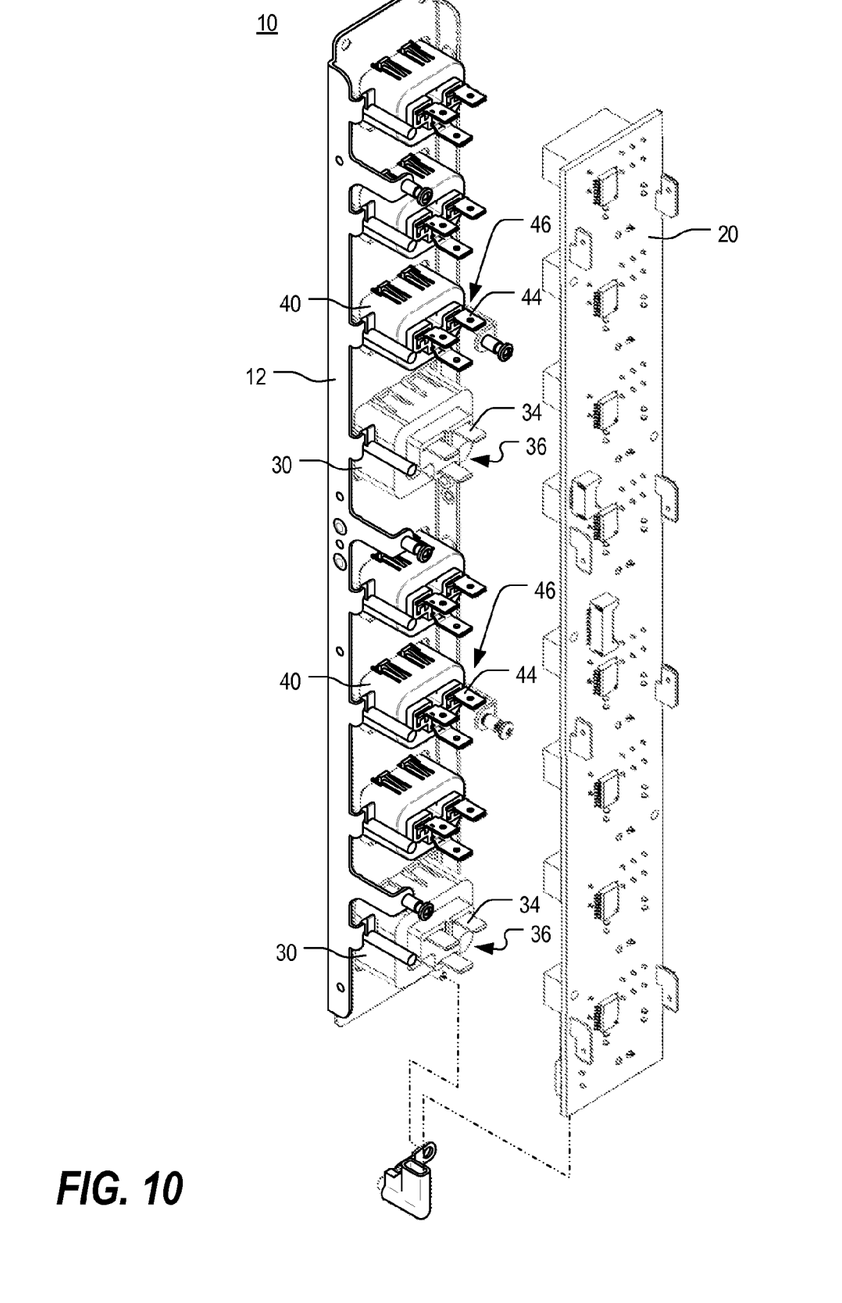
FIG. 10 is a partially exploded rear isometric view of the power distribution unit of FIG. 2.

This feature is further illustrated in FIG. 10, which is a partially exploded rear isometric view of the power distribution unit 10 of FIG. 2. As shown in FIG. 10, each outlet adapter 30,40 has a matching pattern (footprint) of the male terminals 34,44, thereby facilitating interchangeability of the outlet adapters 30,40 as the need arises. Male terminals 34,44 for the differently sized outlet adapters 30,40 have matching spacing schemes so as to permit mating engagement with a single arrangement of female terminals 24 on the printed circuit board 20. Male terminals 34,44 may similarly be matched in height to simplify replacement of the cover plate 12 to accommodate different arrangements or configurations of outlet adapters 30,40.

Figure 11:
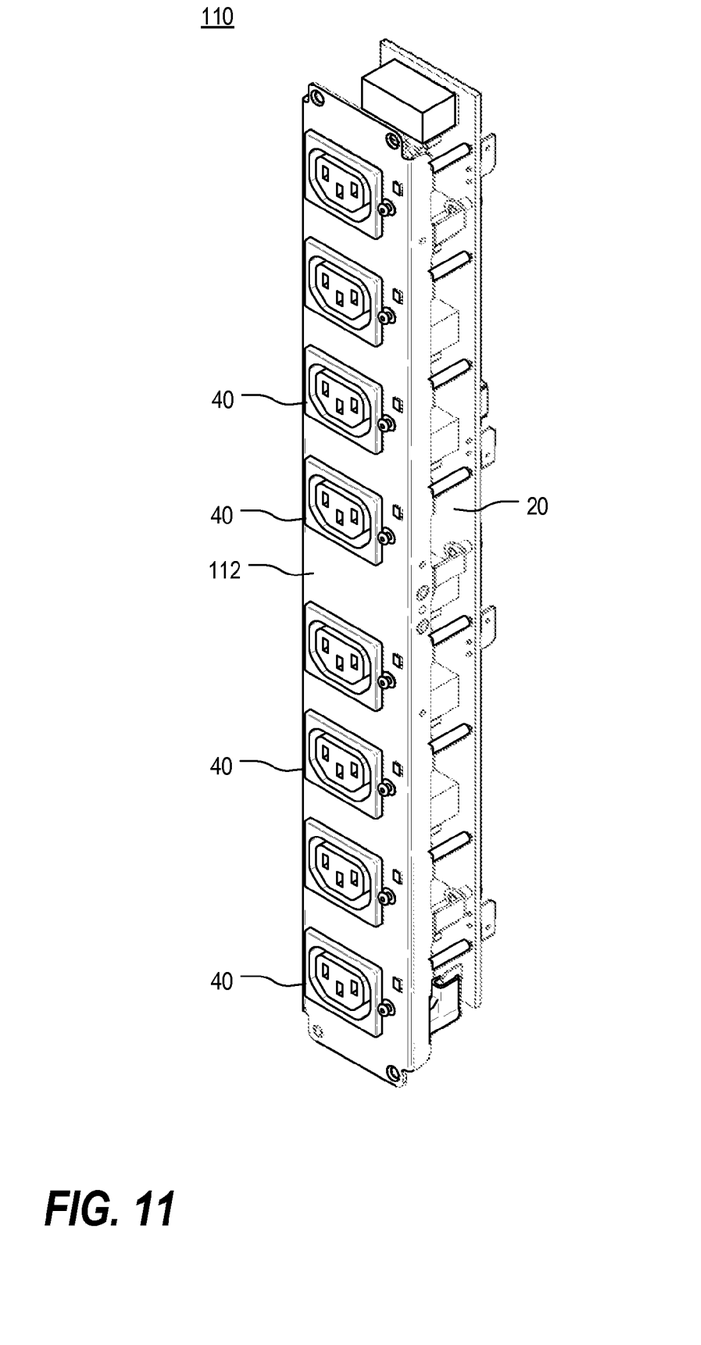
FIG. 11 is an alternative implementation or configuration of the power distribution unit of FIG. 2, illustrating the applicability of the present invention.

FIG. 11 is an alternative implementation or configuration of the power distribution unit 10 of FIG. 2, illustrating the applicability of the present invention. In FIG. 11, the power distribution unit 10 of FIG. 2 has been rebuilt into a reconfigured power distribution unit 110 having a different set of outlet adapters 30,40. In particular, the power distribution unit 110 of FIG. 11 has a cover plate 112 that is different from the cover plate 12 of FIG. 2, but is paired with the same printed circuit board 20 as that of the implementation of FIG. 2. In the configuration of FIG. 11, the power distribution unit 110 includes eight C13-type outlet adapters 40, while in the implementation of FIG. 2, the power distribution unit 10 included six C13-type outlet adapters 40 and two C19-type outlet adapters 30. With the exception of the cover plate 12,112, however, the two PDU implementations 10,110 otherwise utilize the same parts.

Although as described and illustrated herein, the conventional C13/C14-type coupler has been modified to have an inlet connector configuration that matches that of a conventional C19/C20-type coupler, it will be appreciated that the C19-type outlet adapter may instead be modified to have an inlet connector configuration that matches that of a conventional C13-type outlet adapter (so long as the female terminal sets are reconfigured to receive them). Furthermore, although C13- and C19-type outlet adapters 30,40 have been illustrated herein, it will be appreciated that the same approach could be utilized with other types of outlet adapters, including, without limitation, C11-, C15-, and C17-type outlet adapters. Still further, it will be appreciated that in come embodiments, the inlet connector configuration need not be that of any industry-standard at all, so long as each outlet adapter utilizes the same inlet configuration. Still further, the PCB-facing inlets could utilize female terminals, or a combination of male and female terminals, so long as the terminal sets on the PCB are reconfigured accordingly.

The present invention thus reduces the need for multiple power distribution units when different power needs arise at a single circuit board location. Interchangeability of outlet adapters 30,40 likewise reduces the quantity of different components that may otherwise be required. Furthermore, with the interchangeability of outlet adapters 30,40, the power distribution unit 10 of the present invention provides for a wide variety of different configurations without the need for additional types of circuit boards. Different configurations of outlet adapters 30,40 within the power distribution unit 10,110 may even be implemented in the field, long after initial assembly. This could be accomplished by removing the cover plate 12,112, adding, removing, or swapping the desired outlet adapters (including the outlet adapters 30,40 illustrated herein), and replacing the cover plate with 12,112 a new cover plate that is configured to accommodate the chosen arrangement of outlet adapters. The PCB 20, and all the connections thereto, could remain in place the entire time.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. A method of interchanging outlet adapter types in a power distribution unit, the method comprising:
   (a) providing a printed circuit board, as part of a power distribution unit, having a plurality of outlet adapter receiving locations and a first outlet adapter, wherein the first outlet adapter includes a user-facing outlet connector, of a first outlet connector type, and a printed circuit board-facing inlet connector, and wherein the first outlet adapter is attached to the printed circuit board, via the inlet connector thereof, at a selected one of the plurality of outlet adapter receiving locations;
   (b) removing the first outlet adapter from the printed circuit board;
   (c) providing a second outlet adapter, having a user-facing outlet connector, of a second outlet connector type that is different from the first outlet connector type, and a printed circuit board-facing inlet connector;
   (d) attaching the second outlet adapter, via the inlet connector thereof, to the printed circuit board at the selected one of the plurality of adapter receiving locations;
   (e) prior to the step of removing the first outlet adapter, of removing a first cover plate that is configured with an opening, of a first size, to accommodate the first outlet adapter; and
   (f) after the step of attaching the second outlet adapter, of replacing the first cover plate with a second cover plate that is configured with an opening, of a second size, to accommodate the second outlet adapter.

2. The method of claim 1, wherein the first outlet adapter has a C13-type outlet connector type, and the second outlet adapter has a C19-type outlet connector type.

3. The method of claim 1, wherein the first outlet adapter has a C19-type outlet connector type, and the second outlet adapter has a C13-type outlet connector type.

4. The method of claim 1, wherein the inlet connector of the first outlet adapter includes terminals arranged in a pattern, wherein the inlet connector of the second outlet adapter includes terminals arranged in a pattern, and wherein the terminal pattern of the first outlet adapter matches that of the second outlet adapter.

5. A method of interchanging outlet adapter types in a power distribution unit, the method comprising:
   (a) providing a printed circuit board, as part of a power distribution unit, having a plurality of outlet adapter receiving locations;
   (b) providing a first outlet adapter, wherein the first outlet adapter includes a user-facing outlet connector, of a first outlet connector type, and a printed circuit board-facing inlet connector, and wherein the first outlet adapter is attached to the printed circuit board, via the inlet connector thereof, at a selected one of the plurality of outlet adapter receiving locations;
   (c) providing a first cover plate removably secured to the printed circuit board with a separate fastener, the first cover plate being configured with an opening, of a first size, to accommodate the first outlet adapter;
   (d) removing the first cover plate from the printed circuit board;
   (e) removing the first outlet adapter from the printed circuit board;
   (f) providing a second outlet adapter, having a user-facing outlet connector, of a second outlet connector type that is different from the first outlet connector type, and a printed circuit board-facing inlet connector;
   (g) attaching the second outlet adapter, via the inlet connector thereof, to the printed circuit board at the selected one of the plurality of adapter receiving locations; and
   (h) replacing the first cover plate with a second cover plate that is configured with an opening, of a second size, to accommodate the second outlet adapter.

6. The method of claim 5, wherein the first outlet adapter has a C13-type outlet connector type, and the second outlet adapter has a C19-type outlet connector type.

7. The method of claim 5, wherein the first outlet adapter has a C19-type outlet connector type, and the second outlet adapter has a C13-type outlet connector type.

8. The method of claim 5, wherein the printed circuit board-facing inlet connector of the first outlet adapter and the printed circuit board-facing inlet connector of the second outlet adapter have matching terminal patterns.

9. The method of claim 8, wherein the printed circuit board-facing inlet connector of the first outlet adapter and the printed circuit board-facing inlet connector of the second outlet adapter each has terminals arranged in a C20-type terminal pattern.

10. A method of interchanging outlet adapter types in a power distribution unit, the method comprising:
   (a) providing a printed circuit board, as part of a power distribution unit, having a plurality of outlet adapter receiving locations and a first outlet adapter, wherein the first outlet adapter includes a user-facing outlet connector, of a first outlet connector type, and a printed circuit board-facing inlet connector, and wherein the first outlet adapter is attached to the printed circuit board, via the inlet connector thereof, at a selected one of the plurality of outlet adapter receiving locations;
   (b) removing the first outlet adapter from the printed circuit board;
   (c) providing a second outlet adapter, having a user-facing outlet connector, of a second outlet connector type that is different from the first outlet connector type, and a printed circuit board-facing inlet connector;
   (d) attaching the second outlet adapter, via the inlet connector thereof, to the printed circuit board at the selected one of the plurality of adapter receiving locations;
   (e) removing a first cover plate that is configured with an opening, of a first size, to accommodate the first outlet adapter; and
   (f) replacing the first cover plate with a second cover plate that is configured with an opening, of a second size, to accommodate the second outlet adapter.

11. The method of claim 10, wherein the first outlet adapter has a C13-type outlet connector type, and the second outlet adapter has a C19-type outlet connector type.

12. The method of claim 10, wherein the first outlet adapter has a C19-type outlet connector type, and the second outlet adapter has a C13-type outlet connector type.

13. The method of claim 10, wherein the inlet connector of the first outlet adapter includes terminals arranged in a pattern, wherein the inlet connector of the second outlet adapter includes terminals arranged in a pattern, and wherein the terminal pattern of the first outlet adapter matches that of the second outlet adapter.

14. A method of interchanging outlet adapter types in a power distribution unit, the method comprising:
  (a) providing a printed circuit board, as part of a power distribution unit, having a plurality of outlet adapter receiving locations and a first outlet adapter, wherein the first outlet adapter includes a user-facing outlet connector, of a first outlet connector type, and a printed circuit board-facing inlet connector, and wherein the first outlet adapter is attached to the printed circuit board, via the inlet connector thereof, at a selected one of the plurality of outlet adapter receiving locations;
  (b) removing the first outlet adapter from the printed circuit board;
  (c) providing a second outlet adapter, having a user-facing outlet connector, of a second outlet connector type that is different from the first outlet connector type, and a printed circuit board-facing inlet connector; and
  (d) attaching the second outlet adapter, via the inlet connector thereof, to the printed circuit board at the selected one of the plurality of adapter receiving locations;
  (e) wherein the printed circuit board-facing inlet connector of the first outlet adapter and the printed circuit board-facing inlet connector of the second outlet adapter have matching terminal patterns; and
  (f) wherein the printed circuit board-facing inlet connector of the first outlet adapter and the printed circuit board-facing inlet connector of the second outlet adapter each has terminals arranged in a C20-type terminal pattern.

15. The method of claim 14, wherein the first outlet adapter has a C13-type outlet connector type, and the second outlet adapter has a C19-type outlet connector type.

16. The method of claim 14, wherein the first outlet adapter has a C19-type outlet connector type, and the second outlet adapter has a C13-type outlet connector type.

* * * * *